United States Patent
Hu et al.

(10) Patent No.: US 10,546,895 B2
(45) Date of Patent: *Jan. 28, 2020

(54) PHASE CHANGE MEMORY STACK WITH TREATED SIDEWALLS

(71) Applicant: Micron Technology, Inc., Boise, ID (US)

(72) Inventors: Yongjun Jeff Hu, Boise, ID (US); Tsz W. Chan, Boise, ID (US); Swapnil Lengade, Boise, ID (US); Everett Allen McTeer, Eagle, ID (US); Shu Qin, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/241,525

(22) Filed: Jan. 7, 2019

(65) Prior Publication Data

US 2019/0140023 A1    May 9, 2019

Related U.S. Application Data

(60) Division of application No. 15/613,823, filed on Jun. 5, 2017, now Pat. No. 10,177,198, which is a continuation of application No. 15/063,179, filed on Mar. 7, 2016, now Pat. No. 9,673,256, which is a
(Continued)

(51) Int. Cl.
*H01L 27/24* (2006.01)
*H01L 45/00* (2006.01)

(52) U.S. Cl.
CPC ...... *H01L 27/2481* (2013.01); *H01L 27/2409* (2013.01); *H01L 45/06* (2013.01); *H01L 45/12* (2013.01); *H01L 45/1233* (2013.01); *H01L 45/1253* (2013.01); *H01L 45/14* (2013.01); *H01L 45/16* (2013.01); *H01L 45/165* (2013.01);
(Continued)

(58) Field of Classification Search
None
See application file for complete search history.

(56) References Cited

U.S. PATENT DOCUMENTS

| 6,143,124 A | 11/2000 | Ahn |
| 9,281,471 B2 | 3/2016 | Hu et al. |
| 9,306,159 B2 | 4/2016 | Chan et al. |

(Continued)

OTHER PUBLICATIONS

U.S. Appl. No. 14/266,365, Restriction Requirement dated Jul. 22, 2015, 6 pgs.
(Continued)

*Primary Examiner* — Mounir S Amer
(74) *Attorney, Agent, or Firm* — Schwegman Lundberg & Woessner, P.A.

(57) ABSTRACT

Memory devices and methods for fabricating memory devices have been disclosed. One such memory device includes a first electrode material formed on a word line material. A selector device material is formed on the first electrode material. A second electrode material is formed on the selector device material. A phase change material is formed on the second electrode material. A third electrode material is formed on the phase change material. An adhesion species is plasma doped into sidewalls of the memory stack and a liner material is formed on the sidewalls of the memory stack. The adhesion species intermixes with an element of the memory stack and the sidewall liner to terminate unsatisfied atomic bonds of the element and the sidewall liner.

17 Claims, 9 Drawing Sheets

Related U.S. Application Data division of application No. 14/266,365, filed on Apr. 30, 2014, now Pat. No. 9,281,471.

(52) U.S. Cl.
CPC ...... *H01L 45/1616* (2013.01); *H01L 45/1675* (2013.01)

(56) References Cited

U.S. PATENT DOCUMENTS

| | | |
|---|---|---|
| 9,673,256 B2 | 6/2017 | Hu et al. |
| 10,177,198 B2 | 1/2019 | Hu et al. |
| 10,224,479 B2 | 3/2019 | Chan et al. |
| 10,325,653 B2 | 6/2019 | Hu et al. |
| 2012/0224413 A1 | 9/2012 | Zhang et al. |
| 2012/0241705 A1 | 9/2012 | Bresolin et al. |
| 2013/0128649 A1 | 5/2013 | Quick et al. |
| 2015/0123066 A1 | 5/2015 | Gealy et al. |
| 2015/0318038 A1 | 11/2015 | Hu et al. |
| 2015/0318467 A1 | 11/2015 | Hu et al. |
| 2015/0318468 A1 | 11/2015 | Chan et al. |
| 2016/0190209 A1 | 6/2016 | Hu et al. |
| 2016/0218282 A1 | 7/2016 | Chan et al. |
| 2017/0358629 A1 | 12/2017 | Hu et al. |
| 2018/0144795 A1 | 5/2018 | Hu et al. |
| 2018/0166629 A1 | 6/2018 | Chan et al. |

OTHER PUBLICATIONS

U.S. Appl. No. 14/266,365, Response filed Sep. 22, 2015 to Restriction Requirement dated Jul. 22, 2015, 5 pgs.
U.S. Appl. No. 14/266,365, Notice of Allowance dated Nov. 2, 2015, 9 pgs.
U.S. Appl. No. 14/266,415, Restriction Requirement dated Jul. 22, 2015, 6 pgs.
U.S. Appl. No. 14/266,415, Response filed Sep. 22, 2015 to Restriction Requirement dated Jul. 22, 2015, 5 pgs.
U.S. Appl. No. 14/266,415, Notice of Allowance dated Nov. 23, 2015, 9 pgs.
U.S. Appl. No. 14/266,456, Restriction Requirement dated Aug. 17, 2015, 7 pgs.
U.S. Appl. No. 14/266,456, Response filed Oct. 19, 2015 to Restriction Requirement dated Aug. 17, 2015, 6 pgs.
U.S. Appl. No. 14/266,456, Non Final Office Action dated Nov. 20, 2015, 11 pgs.
U.S. Appl. No. 14/266,456, Response filed Feb. 17, 2016 to Final Office Action dated Nov. 20, 2015, 7 pgs.
U.S. Appl. No. 14/266,456, Final Office Action dated Jun. 16, 2016, 13 pgs.
U.S. Appl. No. 14/266,456, Response filed Aug. 11, 2016 to Final Office Action dated Jun. 16, 2016, 7 pgs.
U.S. Appl. No. 14/266,456, Advisory Action dated Sep. 23, 2016, 3 pgs.
U.S. Appl. No. 14/266,456, Response filed Nov. 16, 2016 to Advisory Action dated Sep. 23, 2016, 9 pgs.
U.S. Appl. No. 14/266,456, Non Final Office Action dated Jun. 16, 2017, 12 pgs.
U.S. Appl. No. 14/266,456, Response filed Nov. 16, 2017 to Non Final Office Action dated Jun. 16, 2017, 11 pgs.
U.S. Appl. No. 14/266,456, Final Office Action dated Feb. 22, 2018, 12 pgs.
U.S. Appl. No. 14/266,456, Response filed Apr. 23, 2018 to Final Office Action dated Feb. 22, 2018, 8 pgs.
U.S. Appl. No. 14/266,456, Advisory Action dated Jul. 13, 2018, 3 pgs.
U.S. Appl. No. 15/063,179, Notice of Allowance dated Feb. 1, 2017, 8 pgs.
U.S. Appl. No. 15/090,292, Non Final Office Action dated May 8, 2017, 8 pgs.
U.S. Appl. No. 15/090,292, Response filed Aug. 8, 2017 to Non Final Office Action dated May 8, 2017, 6 pgs.
U.S. Appl. No. 15/090,292, Notice of Allowance dated May 22, 2018, 8 pgs.
U.S. Appl. No. 15/613,823, Preliminary Amendment filed Aug. 31, 2017, 8 pgs.
U.S. Appl. No. 15/613,823, Restriction Requirement dated Jan. 12, 2018, 6 pgs.
U.S. Appl. No. 15/613,823, Response filed Feb. 15, 2018 to Restriction Requirement dated Jan. 12, 2018, 8 pgs.
U.S. Appl. No. 15/613,823, Non Final Office Action dated May 11, 2018, 8 pgs.
U.S. Appl. No. 15/613,823, Response filed Aug. 2, 2018 to Non Final Office Action dated May 11, 2018, 7 pgs.
U.S. Appl. No. 15/613,823, Notice of Allowance dated Oct. 4, 2018, 7 pgs.
Liu, Zheng, et al., "Ultrathin high-temperature oxidation-resistant coatings of hexagonal boron nitride", Nature Communications, 4(2541), (Oct. 4, 2013), 1-8.
U.S. Appl. No. 14/266,365, U.S. Pat. No. 9,281,471, filed Apr. 30, 2014, Phase Change Memory Stack With Treated Sidewalls.
U.S. Appl. No. 15/063,179, U.S. Pat. No. 9,673,256, filed Mar. 7, 2016, Phase Change Memory Stack With Treated Sidewalls.
U.S. Appl. No. 15/613,823, U.S. Pat. No. 10,177,198, filed Jun. 5, 2017, Phase Change Memory Stack With Treated Sidewalls.
U.S. Appl. No. 14/266,415, U.S. Pat. No. 9,306,159, filed Apr. 30, 2014, Phase Change Memory Stack With Treated Sidewalls.
U.S. Appl. No. 15/090,292, U.S. Pat. No. 10,079,340, filed Apr. 4, 2016, Phase Change Memory Stack With Treated Sidewalls.
U.S. Appl. No. 14/266,456, filed Apr. 30, 2014, Phase Change Memory Stack With Treated Sidewalls.
U.S. Appl. No. 15/882,666, filed Jan. 29, 2018, Phase Change Memory Stack With Treated Sidewalls.

PHASE CHANGE MEMORY STACK WITH TREATED SIDEWALLS

PRIORITY APPLICATION

This application is a divisional of U.S. application Ser. No. 15/613,823, filed Jun. 5, 2017, which is a continuation of U.S. application Ser. No. 15/063,179, filed Mar. 7, 2016, now issued as U.S. Pat. No. 9,673,256, which is a divisional of U.S. application Ser. No. 14/266,365, filed Apr. 30, 2014, now issued as U.S. Pat. No. 9,281,471, all of which are incorporated herein by reference in their entirety.

BACKGROUND

Memory devices are typically provided as internal, semiconductor, integrated circuits in apparatuses such as computers or other electronic devices. There are many different types of memory including random-access memory (RAM), read only memory (ROM), dynamic random access memory (DRAM), synchronous dynamic random access memory (SDRAM), and non-volatile (e.g., phase change memory, flash) memory.

Non-volatile memories are important elements of integrated circuits due to their ability to maintain data absent a power supply. Phase change materials have been investigated for use in non-volatile memory cells. Phase change memory (PCM) elements include phase change materials, such as chalcogenide alloys, that are capable of stably transitioning between amorphous and crystalline phases. Each phase exhibits a particular resistance state and the resistance states distinguish the logic values of the memory element. Specifically, an amorphous state exhibits a relatively high resistance and a crystalline state exhibits a relatively low resistance. One of different logic levels (e.g., logic 1 or logic 0) can be assigned to each of these states.

Thus, there are general needs to improve PCM devices.

DETAILED DESCRIPTION

As described subsequently, a method for fabricating a memory stack (e.g., memory device) with treated sidewalls can increase the adhesion of dielectric passivation material to the electrodes. This can reduce inter-diffusion between the electrodes and adjacent materials in the memory stack.

Figure 1:
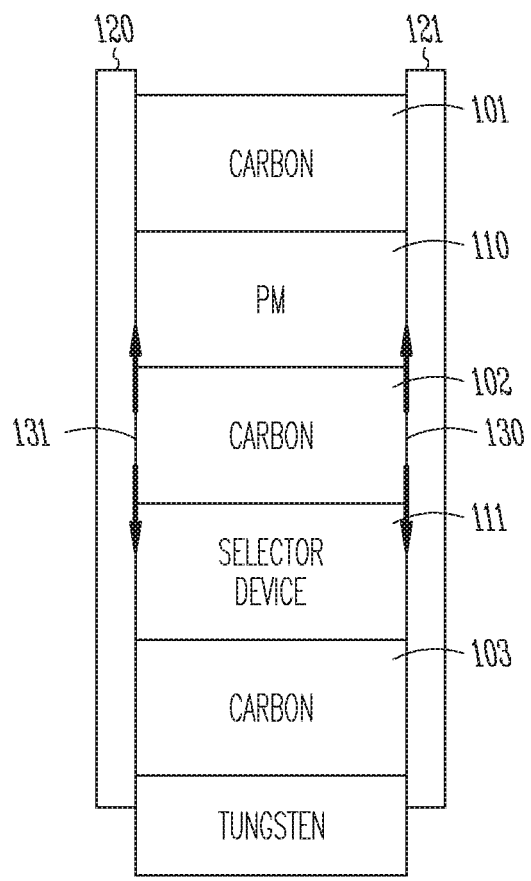
FIG. 1 illustrates a cross-sectional view of a typical phase change memory stack.

FIG. 1 illustrates a typical memory cell stack for a PCM. Carbon can be used as top 101, middle 102, and bottom 103 electrodes for the memory cell stack. Carbon is chemically inert and does not react easily with the phase change material 110 or the selector device material 111. This inert chemistry can also lead to poor adhesion of sidewalls to the carbon electrodes. As a result, it can be possible for the sidewall material 120, 121 to inter-diffuse 130, 131 between the selector device material 111 and the phase change material 110. This can occur at higher temperatures. The inter-diffusion can cause reliability issues, degrade leakage current, and affect threshold voltage stability.

FIGS. 2-7 illustrate various steps in fabricating a memory stack (e.g., PCM) in addition to treating the sidewalls of the memory stack with an adhesion species. These fabrication steps are for purposes of illustration only as the different elements of the stack can be formed by different processes.

Figure 2:
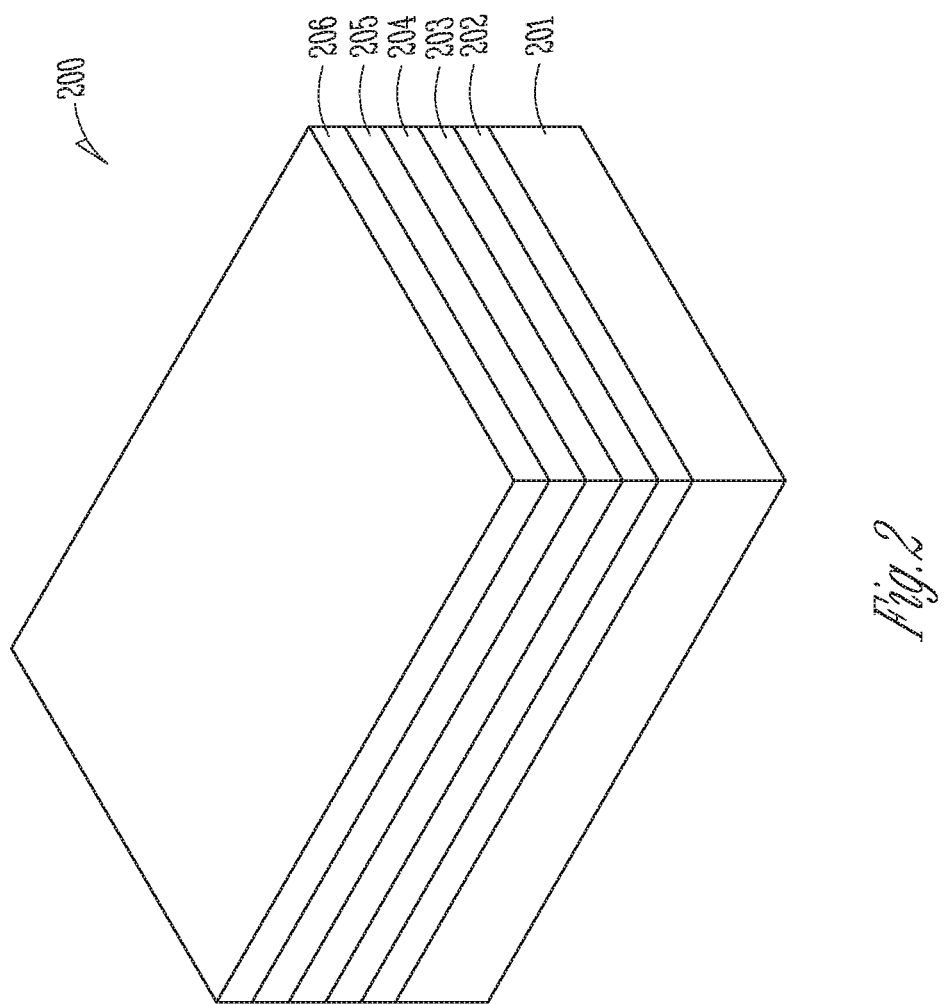
FIGS. 2-7 illustrate an embodiment of a process flow to fabricate a phase change memory stack having treated sidewalls.

FIG. 2 illustrates an embodiment of a blanket deposition of the initial memory stack material 200. The memory stack can include a word line material (e.g., tungsten (W)) 201. A first electrode material 202 (e.g., carbon) can be formed on the word line material 201. A selector device material 203 may be formed on the first electrode material 202.

The selector device material 203 (SD) may include Selenium (Se), Arsenic (As), Germanium (Ge), Tin (Sn), Tellurium (Te), Silicon (Si), Lead (Pb), Carbon (C), or Bismuth (Bi) as well as other materials. Other embodiments can include selector device material 203 comprising one or more of these elements as well as one or more of these elements combined with other elements.

A second electrode material 204 (e.g., carbon) can be formed on the selector device material 203. A phase change material 205 can be formed on the second electrode material 204.

The phase change material 205 (PM) can include chalcogenide elements such as Germanium (Ge), Antimony (Sb), Tellurium (Te), Indium (In) as well as other chalcogenide elements, combinations of these elements, or combinations of these elements with other elements. The phase change material 205 can additionally include Aluminum (Al), Gallium (Ga), Tin (Sn), Bismuth (Bi), Sulphur (S), Oxygen (O), Gold (Au), Palladium (Pd), Copper (Cu), Cobalt (Co), Silver (Ag), or Platinum (Pt) as well as other elements. Additional embodiments can combine these elements with the chalcogenide elements.

A third electrode material 206 (e.g., carbon) can be formed on the phase change material 205. Forming the third electrode material 206, as well as the other materials 201-205 of the memory stack, can be done with a blanket deposition method or some other deposition method.

Figure 3:
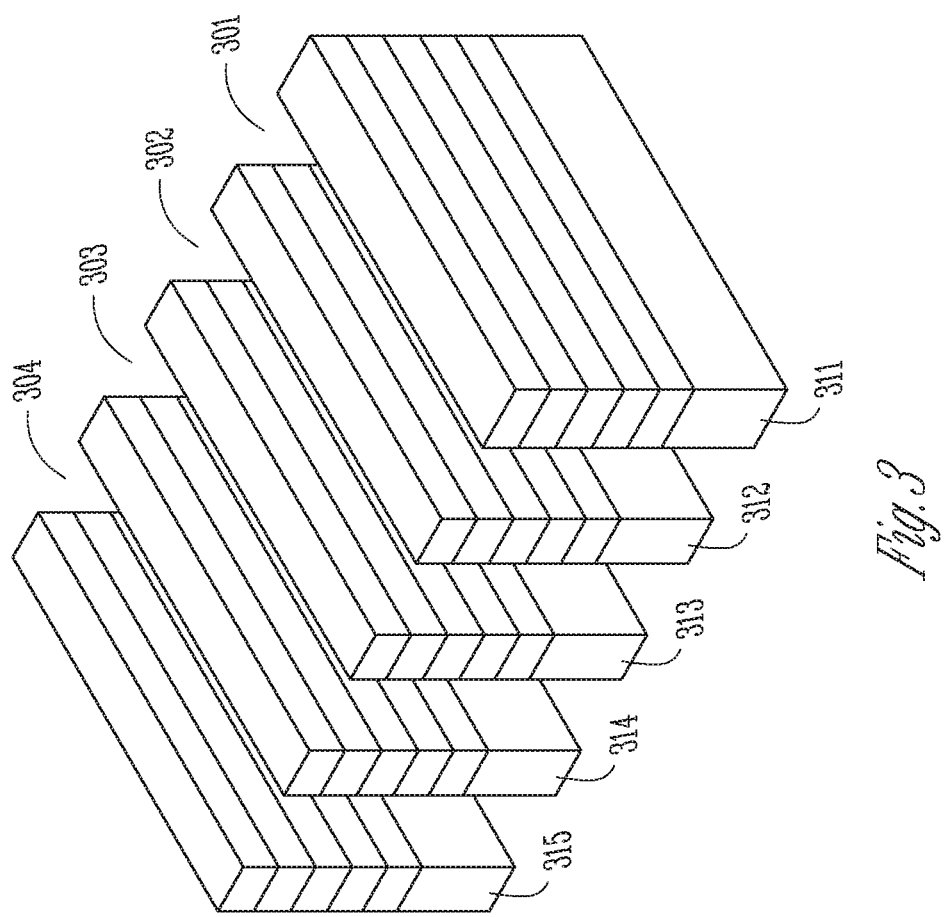

After the initial memory stack material 200 has been formed, an etch process (e.g., dry etch) can be performed on the stack material 200 to create trenches 301-304 as illustrated in FIG. 3. FIG. 3 illustrates that the stack material 200 has been divided by the plurality of trenches 301-304 into a plurality of memory stacks 311-315, each stack comprising the architecture illustrated in FIG. 2. In some embodiments (not shown), a plurality of trenches is formed in the stack material to less than its full height.

Figure 7:
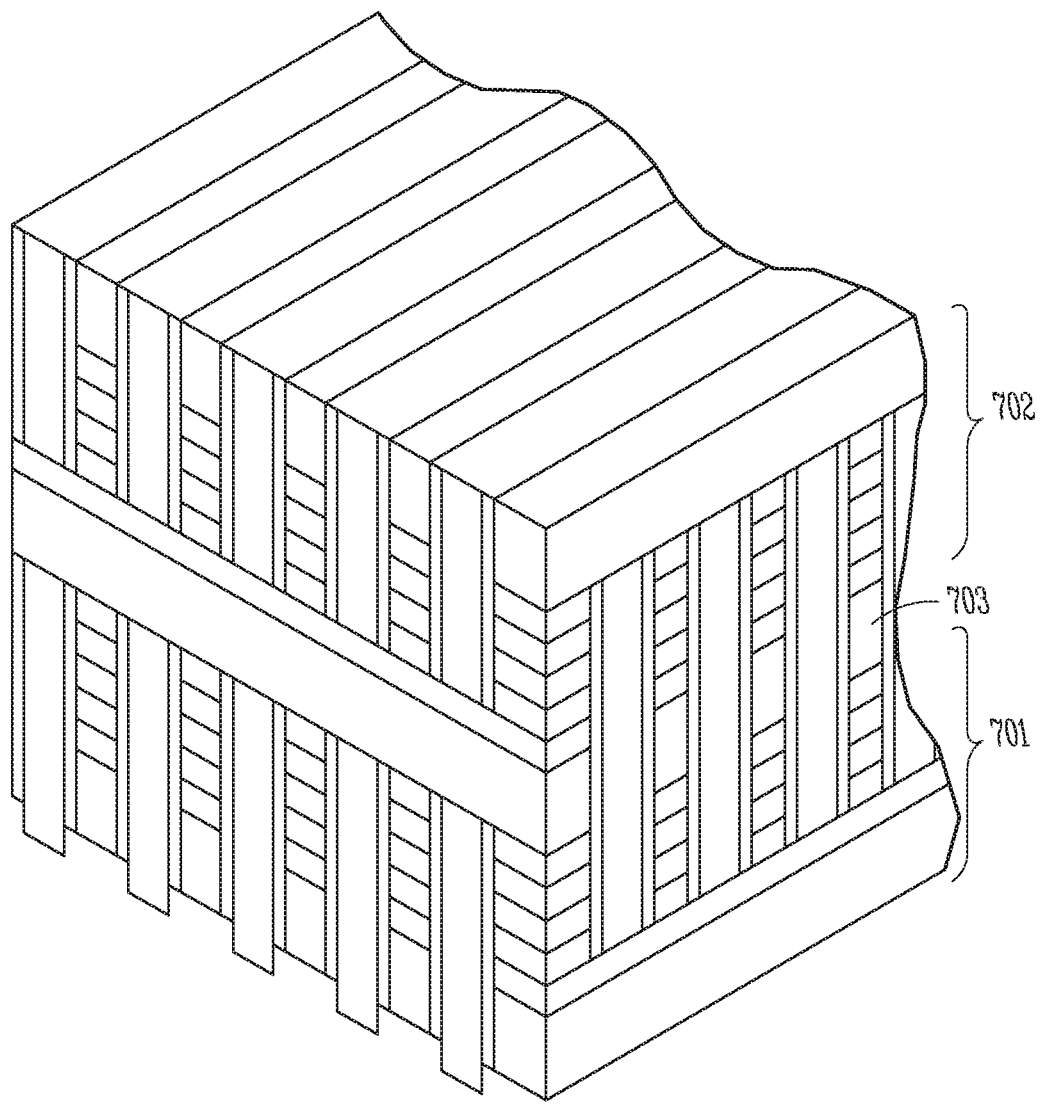

In another embodiment, the stack material 200 can be dry etched patterned in both x and y directions. Thus, subsequent sidewall liners can be added on four sidewalls, as illustrated in FIG. 7.

Figure 4:
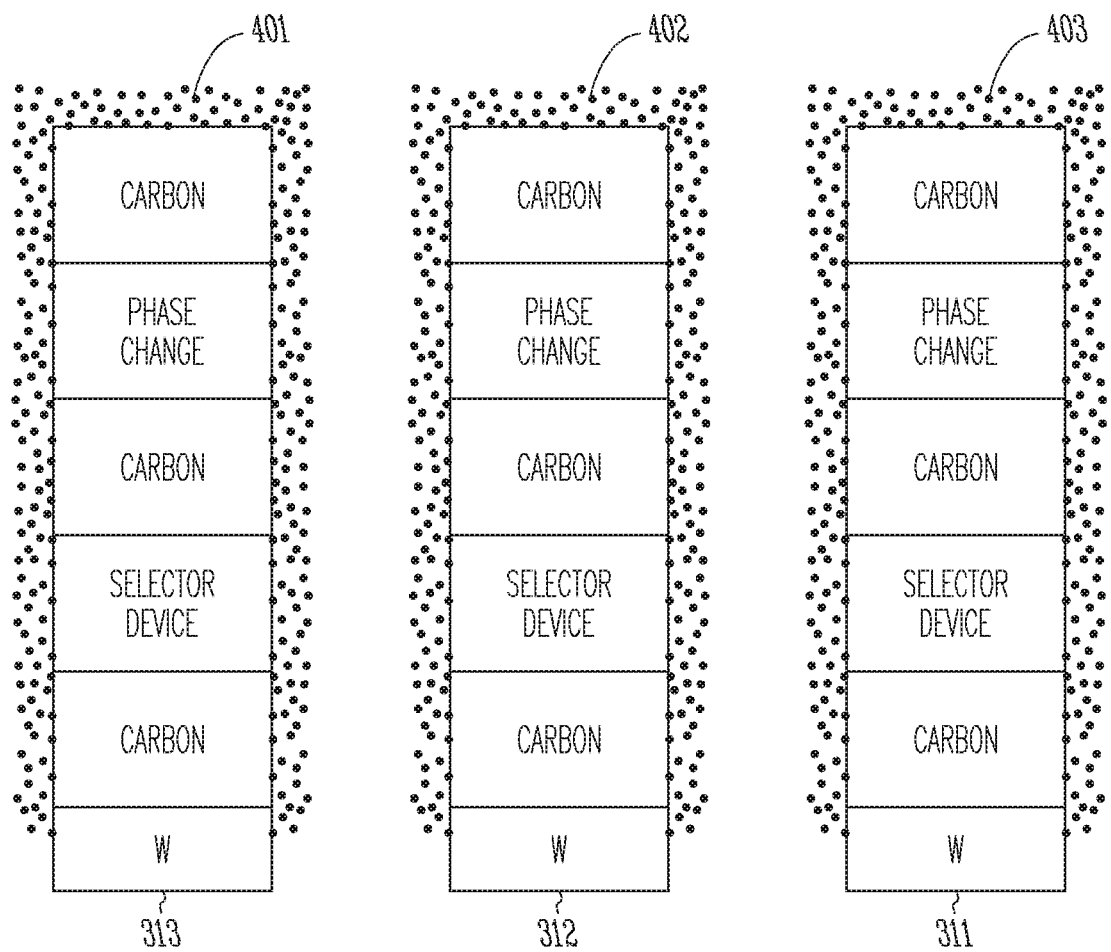
Figure 5:
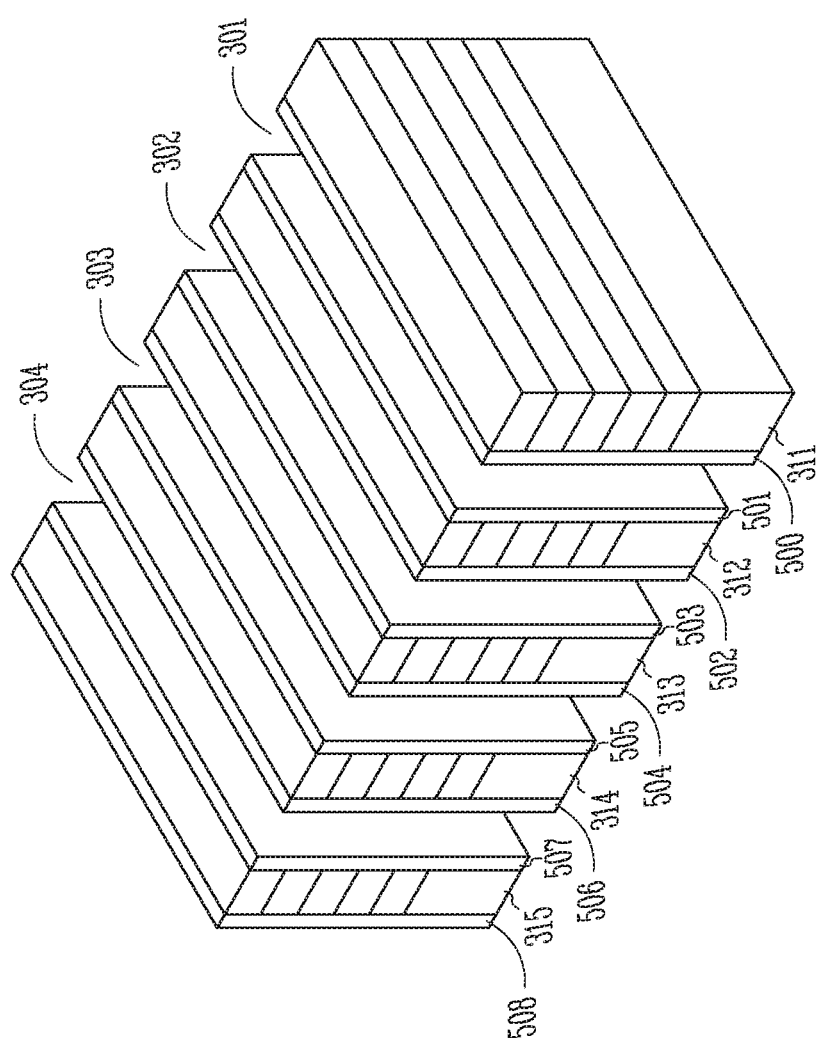

FIG. 4 illustrates the treatment of the sidewalls or sidewall liners (as seen in FIG. 5) of particular ones of the stacks 311-313 as formed in FIG. 3. This treatment enhances the dielectric liner adhesion to the electrode surfaces. In an embodiment, a plasma immersion technique (e.g., plasma doping (PLAD)) can be used to implant an adhesion species 401-403 in either the stack sidewalls or the sidewall liners.

In an embodiment, the dielectric sidewalls or sidewall liners (as seen in FIG. 5) can be treated with an adhesion species 401-403 (e.g., boron) by exposing the sidewalls to the adhesion species mixed in a carrier gas. For example, boron can be mixed with a flourine carrier gas such that the sidewalls or the sidewall liners are exposed to the boron triflouride ($BF_3$) during the plasma doping, as illustrated in greater detail with reference to FIGS. 4 and 8. Boron has properties that are between metals and non-metals. Chemically it is more related to silicon than to aluminum, gallium, indium, or thallium. Fluorine is electro-negative and reactive of all elements and reacts with most organic and inorganic substances.

Relatively low energy plasma immersion implant can have advantages if used in this process. For example, conformal doping can be used in the process in order to achieve a tunable implant/deposition operation regime and a shallow profile. The ion bombardment nature of an implant process can enhance an adhesion-friendly species (e.g., boron) by intermixing with the electrode material. For example, the implanted adhesion species can improve adhesion by species intermixing and terminating unsatisfied atomic bonds (e.g., carbon bonds). Other adhesion species 401-403 that have substantially similar properties can also be used. To form the PCM cells, electrically insulated pillars are formed (e.g., by dry etching) in the bit line direction while the memory stacks are formed in the word line direction.

FIG. 5 illustrates an embodiment for forming the sidewall liners 500-508 on the sidewalls of the stacks 311-315. The process to form the sidewall liners 500-508 can include any dielectric material that can be deposited by any deposition process. For example, the sidewall deposition can include a Plasma Enhanced Atomic Layer Deposition (PEALD) process using a dielectric material such as $AlSiO_x$. Any dielectric material can be used during the sidewall deposition.

Figure 6:
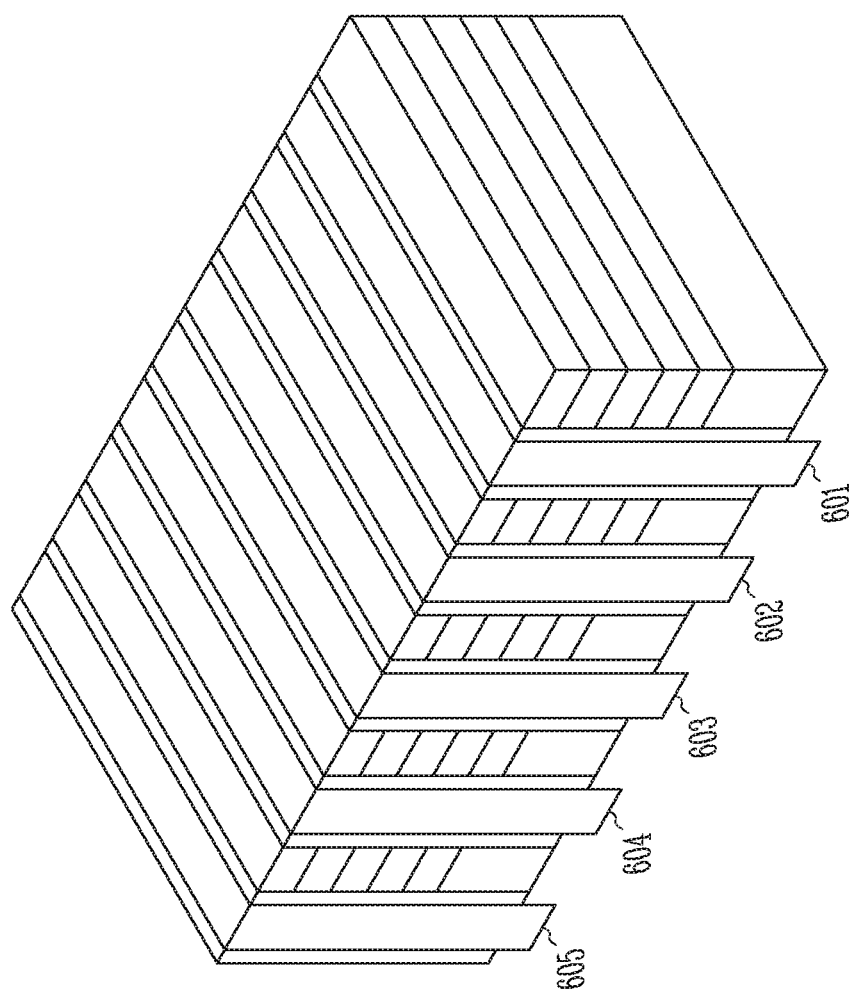

FIG. 6 illustrates an embodiment for forming a dielectric fill material 601-604 between adjacent memory stacks. The dielectric fill material 601-604 can electrically isolate each of the memory stacks. The dielectric fill material 601-604 can be the same material as the sidewall liners 500-508 or a different dielectric material.

FIG. 7 illustrates an embodiment for forming additional decks of memory stacks. For example, FIG. 7 shows two memory stacks 701, 702 coupled together at a common bit line 703. The sidewalls or the sidewall liner treatment described previously with reference to FIG. 4 and below with reference to FIG. 8 may be repeated for the memory stacks at each of the decks. Other embodiments can have additional decks of memory stacks 701, 702.

Figure 8:
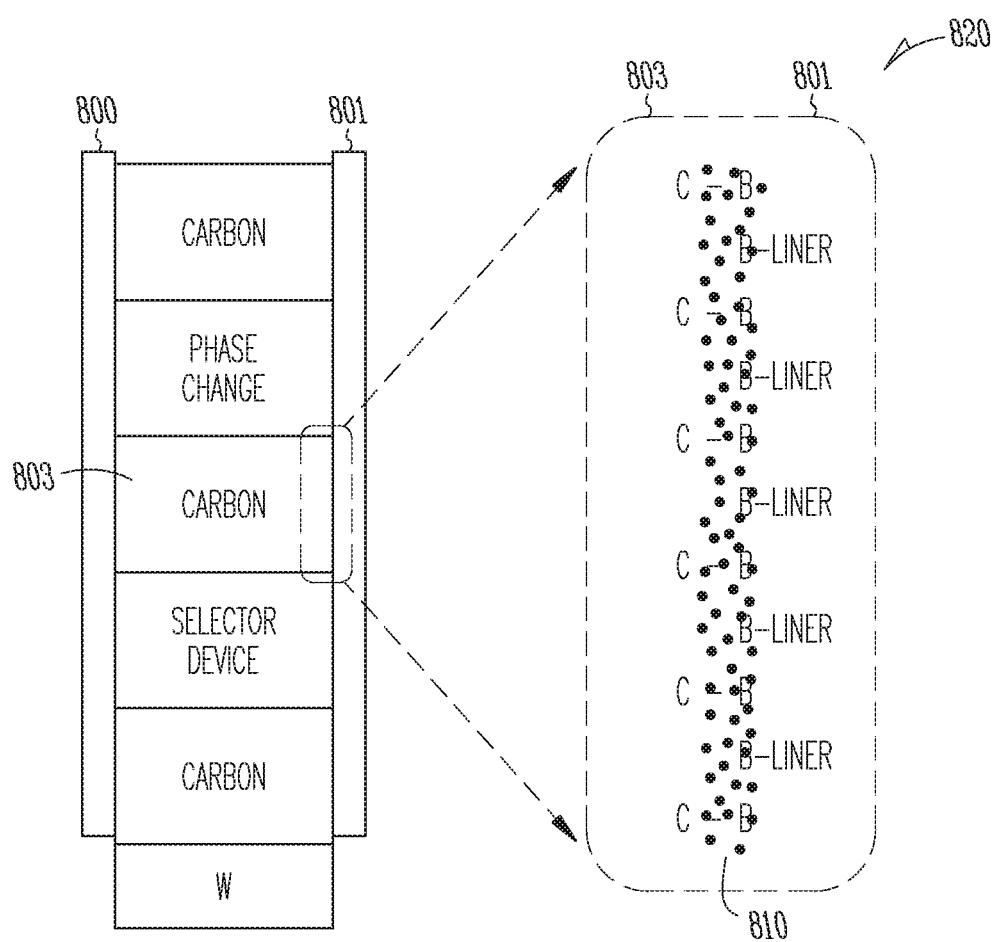
FIG. 8 illustrates a detailed cross-sectional view of an embodiment of intermixing of an implanted adhesion species on memory stack sidewalls.

FIG. 8 illustrates a detailed cross-sectional view of an embodiment of intermixing of an implanted adhesion species on memory stack sidewalls. The implanted adhesion species has been shown and described as being implanted into the sidewalls of the memory stacks but other embodiments may implant the adhesion species into the sidewall liners.

FIG. 8 shows an enlarged detail view 820 of the atomic level intermixing boundary 810 between the second electrode material 803, the adhesion species, and the memory stack liner 801. This diagram shows that the adhesion species (e.g., boron) intermixes with the material of the electrode (e.g., carbon) and the liner 801 to cause enhanced adhesion of the liner 801 to the electrode material 803. The intermixing can be accomplished by the adhesion species terminating unsatisfied atomic bonds of both the electrode material 803 and the liner 801.

The represented sequence of layers is for purposes of illustration only. Other embodiments can use other sequences. For example, the relative position of the PM and select material (SD) may be exchanged. Also, the relative positions of word line material and bit line material may be changed (e.g., having bit lines at the bottom of the first deck and word lines at the top of the first deck and possibly shared with a second deck stack.

Figure 9:
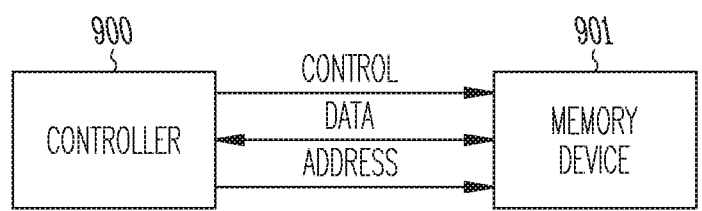
FIG. 9 illustrates a block diagram of a memory system in accordance with the embodiments of FIGS. 2-8.

FIG. 9 illustrates a block diagram of a memory system that include a memory device 901 that can use the memory stacks with treated sidewalls of FIGS. 2-8. A controller 900 may be used to control operations of the system. The memory device 901, coupled to the controller 900, may include a memory array comprising memory cell stacks as described above with reference to FIGS. 2-8.

The controller 900 may be coupled to the memory device 901 over control, data, and address buses. In another embodiment, the address and data buses may share a common input/output (I/O) bus. The controller 900 can be part of the same integrated circuit as the memory device 901 or as separate integrated circuits.

As used herein, an apparatus may refer to, for example, circuitry, an integrated circuit die, a memory device, a memory array, or a system including such a circuit, die, device or array.

CONCLUSION

One or more embodiments of the method for memory stack sidewall treatment can result in a memory device with memory stacks having enhanced adhesion to the sidewall liners. For example, an adhesion species (e.g., boron) can intermix with particular materials of the memory stack to create better adhesion and, thus, reduced sidewall material inter-diffusion. The sidewalls can be treated with the adhesion species using a $BF_3$ PLAD sidewall treatment.

Although specific embodiments have been illustrated and described herein, it will be appreciated by those of ordinary skill in the art that any arrangement that is calculated to achieve the same purpose may be substituted for the specific embodiments shown. Many adaptations will be apparent to those of ordinary skill in the art. Accordingly, this application is intended to cover any adaptations or variations.

What is claimed is:

1. A method for fabricating a memory device comprising:
   forming multiple memory stacks, including,
      forming first and second carbon electrodes in vertically spaced relation to one another and over a conductive line material;
      forming a chalcogenide-containing material between the first and second carbon electrodes;
      patterning and etching materials including the first and second carbon electrodes and the chalcogenide material to define multiple memory stacks;
   implanting an adhesion species into the sidewalls of the first and second carbon electrodes; and
   forming a liner material on the sidewalls of each memory stack wherein the adhesion species intermixes the carbon of the first and second carbon electrodes and the sidewall liner.

2. The method of claim 1, further comprising:
   forming a third carbon electrode in vertically spaced relation to the first and second carbon electrodes, and on the opposite side of the second carbon electrode from the first carbon electrode; and
   forming a selector device material between the second and third carbon electrodes.

3. The method of claim 2 further comprising:
   implanting the adhesion species into the sidewalls of the third carbon electrode as part of the same operation of implanting the adhesion species into the sidewalls of the first and second carbon electrodes; and wherein the adhesion species intermixes with the carbon of the third carbon electrode and the sidewall liner material.

4. The method of claim 1, wherein the chalcogenide-containing material comprises one or more of Germanium (Ge), Antimony (Sb), Tellurium (Te), and Indium (In).

5. The method of claim 4, wherein the chalcogenide-containing material further comprises one or more of Aluminum (Al), Gallium (Ga), Tin (Sn), Bismuth (Bi), Sulphur (S), Oxygen (O), Gold (Au), Palladium (Pd), Copper (Cu), Cobalt (Co), Silver (Ag), and Platinum (Pt).

6. The method of claim 1, wherein the adhesion species acts to terminate unsatisfied atomic bonds of the element and the sidewall liner.

7. The method of claim 1, wherein implanting the adhesion species into the sidewalls of the first and second carbon electrodes comprises implanting boron using a plasma doping process to perform a conformal doping process.

8. The method of claim 1, wherein forming the sidewall liner material comprises forming a dielectric material on the sidewalls of each memory stack.

9. A method for fabricating a memory device comprising:
forming multiple memory stacks, including,
forming first and second carbon electrodes in vertically spaced relation to one another and over a conductive line material;
forming a chalcogenide-containing material between the first and second carbon electrodes;
patterning and etching materials including the first and second carbon electrodes and the chalcogenide material to define multiple memory stacks;
forming a liner material on the sidewalls of each memory stack; and
implanting an adhesion species into the sidewall liner material, wherein the adhesion species intermixes with the sidewall liner material and with the carbon of the first and second carbon electrodes.

10. The method of claim 9, wherein the sidewall liner material comprises a dielectric material.

11. The method of claim 10, further comprising:
forming a third carbon electrode in vertically spaced relation to the first and second carbon electrodes, and on the opposite side of the second carbon electrode from the first carbon electrode; and
wherein the adhesion species further intermixes with the carbon of the third carbon electrode.

12. The method of claim 11, further comprising forming a selector device material between the second and third carbon electrodes.

13. The method of claim 9, wherein the chalcogenide-containing material comprises one or more of Germanium (Ge), Antimony (Sb), Tellurium (Te), and Indium (In).

14. The method of claim 13, wherein the chalcogenide-containing material further comprises one or more of Aluminum (Al), Gallium (Ga), Tin (Sn), Bismuth (Bi), Sulphur (S), Oxygen (O), Gold (Au), Palladium (Pd), Copper (Cu), Cobalt (Co), Silver (Ag), and Platinum (Pt).

15. The method of claim 9, wherein the adhesion species acts to terminate unsatisfied atom bonds of the carbon electrodes.

16. The method of claim 9, wherein the adhesion species comprises boron.

17. The method of claim 16, wherein implanting the boron-comprising adhesion species comprises using a plasma doping process to perform a conformal doping process.

* * * * *